US006930948B2

(12) United States Patent
Lee et al.

(10) Patent No.: US 6,930,948 B2
(45) Date of Patent: Aug. 16, 2005

(54) SEMICONDUCTOR MEMORY DEVICE HAVING AN INTERNAL VOLTAGE GENERATION CIRCUIT FOR SELECTIVELY GENERATING AN INTERNAL VOLTAGE ACCORDING TO AN EXTERNAL VOLTAGE LEVEL

(75) Inventors: Kyu-Chan Lee, Seoul (KR); Sang-Jae Rhee, Kyunggi-do (KR); Jung-Yong Choi, Kyunggi-do (KR); Jong-Hyun Choi, Kyunggi-do (KR); Jong-Sik Na, Kyunggi-do (KR); Jae-Hoon Kim, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 128 days.

(21) Appl. No.: 10/621,165

(22) Filed: Jul. 15, 2003

(65) Prior Publication Data

US 2004/0017690 A1 Jan. 29, 2004

(30) Foreign Application Priority Data

Jul. 16, 2002 (KR) .............................. 10-2002-0041543

(51) Int. Cl.[7] .............................................. G11C 11/00
(52) U.S. Cl. ...................... 365/226; 323/314; 323/313
(58) Field of Search ......................... 365/226; 323/313, 323/314; 327/538

(56) References Cited

U.S. PATENT DOCUMENTS 5,570,005 A * 10/1996 Hardee et al. ................. 424/59
5,912,856 A *  6/1999 Lee et al. ..................... 365/226

6,661,279 B2 * 12/2003 Yabe ............................ 327/546
6,836,104 B2 * 12/2004 Yoshihara .................... 323/314
6,861,872 B2 *  3/2005 Suh .............................. 326/62
2003/0214278 A1 * 11/2003 Yoshihara .................... 323/314

FOREIGN PATENT DOCUMENTS

| JP | 11-086544 | | 3/1999 | |
|---|---|---|---|---|
| JP | 411202955 A | * | 7/1999 | |
| JP | 411231951 A | * | 8/1999 | ............. G05F/1/56 |
| JP | 02002237186 A | * | 8/2002 | ......... G11C/11/407 |

OTHER PUBLICATIONS

English Language Abstract of Japanese Publication No. 11-086544.

* cited by examiner

*Primary Examiner*—Viet Q. Nguyen
(74) *Attorney, Agent, or Firm*—Marger Johnson & McCollom, P.C.

(57) ABSTRACT

An external high/low voltage compatible semiconductor memory device includes an internal voltage pad, an internal voltage generation circuit, and an internal voltage control signal generation circuit. The internal voltage pad connects a low external voltage with an internal voltage, and the internal voltage generation circuit generates an internal voltage in response to an internal voltage control signal and a high external voltage. The internal voltage control signal generation circuit generates an internal voltage control signal according to an high or low external voltage. Thus, a database of the semiconductor memory device can be managed without classifying the database into databases for the high voltage and databases for the low voltage because of the internal voltage control signal. In addition, the internal voltage level is stable because charges provided to the internal voltage are regulated according to a voltage level of the external voltage.

11 Claims, 15 Drawing Sheets

US 6,930,948 B2

SEMICONDUCTOR MEMORY DEVICE HAVING AN INTERNAL VOLTAGE GENERATION CIRCUIT FOR SELECTIVELY GENERATING AN INTERNAL VOLTAGE ACCORDING TO AN EXTERNAL VOLTAGE LEVEL

CROSS REFERENCE TO RELATED APPLICATIONS

This application claims priority from Korean Patent Application No. 2002-41543, filed on Jul. 16, 2002, the contents of which are hereby incorporated by reference in their entirety for all purposes.

BACKGROUND OF THE INVENTION

1. Technical Field of the Invention

This disclosure relates to a semiconductor memory device and, more specifically, to a semiconductor memory device having an internal voltage generation circuit for selectively generating an internal voltage according to an external voltage level.

2. Description of the Related Art

In semiconductor memory devices for use in mobile apparatuses, low voltage operation is the most significant factor. The design of a low voltage semiconductor memory device varies according to the external voltage used. For example, if an external voltage is a high voltage, an internal voltage generation circuit is employed to lower the high voltage and the lowered voltage is used as an internal voltage. If an external voltage is already a low voltage, the external voltage is used directly as an internal voltage. Thus, designers manage basic database with two mask sets based on an external low voltage or an external high voltage.

A low/high voltage compatible semiconductor memory device is now described below with reference to FIG. 1.

Referring to FIG. 1, a first database 100 of a semiconductor memory device for a low voltage has a layout in which an external low voltage is bonded to an internal voltage pad 110, which is coupled to a chip internal circuit 120. An internal voltage generation circuit 130 of an active state, an internal voltage generation circuit 140 of a stand-by state, and a reference voltage generation circuit 150 are all disabled. On the other hand, a second database 200 of a semiconductor memory device for a high voltage has a layout in which an internal voltage pad 110 floats and an internal voltage generation circuit 130 of an active state, an internal voltage generation circuit 140 of a stand-by state, and a reference voltage generation circuit 150 are enabled to compare an external high voltage with a reference, thereby generating an internal voltage.

Independently managing the first and second database is troublesome and may cause an error in selection of database for revision. In addition, mask sets must be managed independently according to the first and second database, which leads to the disadvantage of high cost. Thus, there is a need for a semiconductor memory device which can simply manage databases and reduce a mask making expenditure.

The internal voltage generation circuits 130 and 140 stably generate an internal voltage depending on the variation of an external voltage and provide the internal voltage to the chip internal circuits 120. An internal voltage level may be slightly varied by the operation of a plurality of sense amplifiers disposed in a chip internal circuit such as, for example, a memory cell array block.

A conventional internal voltage generation circuit is now described below by reference to FIG. 2, in which an internal voltage generation circuit 130 of an active state is representatively illustrated.

Referring to FIG. 2, the internal voltage generation circuit 130 provides an external voltage VEXT to an internal voltage VINT by means of a PMOS transistor 138 which is responsive to an output of an NMOS transistor controlled by an output of an enable pulse generator 134. The internal voltage VINT is is compared with the reference voltage VREF by the comparator 132. An output of the comparator 132 controls the PMOS transistor 138, so that a feedback loop is established to provide the internal voltage VINT.

In the internal voltage generation circuit 130, a lowering of the internal voltage VINT may occur when a plurality of sense amplifiers in a memory cell array block 120' operate at the same time. Unfortunately, the internal voltage generation circuit 130 is incapable of stably maintaining the level of the internal voltage VINT. Thus, there is a need for an internal voltage generation circuit which can stably generate an internal voltage.

Embodiments of the invention address this and other disadvantages of the conventional art.

SUMMARY OF THE INVENTION

Embodiments of the invention provide a semiconductor memory device that can simply manage a database irrespective of the level of an external voltage and reduce a mask making expenditure. Embodiments of the invention also provide a semiconductor memory device that can stably generate an internal voltage according to the level of an external voltage.

DETAILED DESCRIPTION OF THE INVENTION

A semiconductor memory device according to an embodiment of the invention is now described below with reference to FIG. 3.

Figure 1:
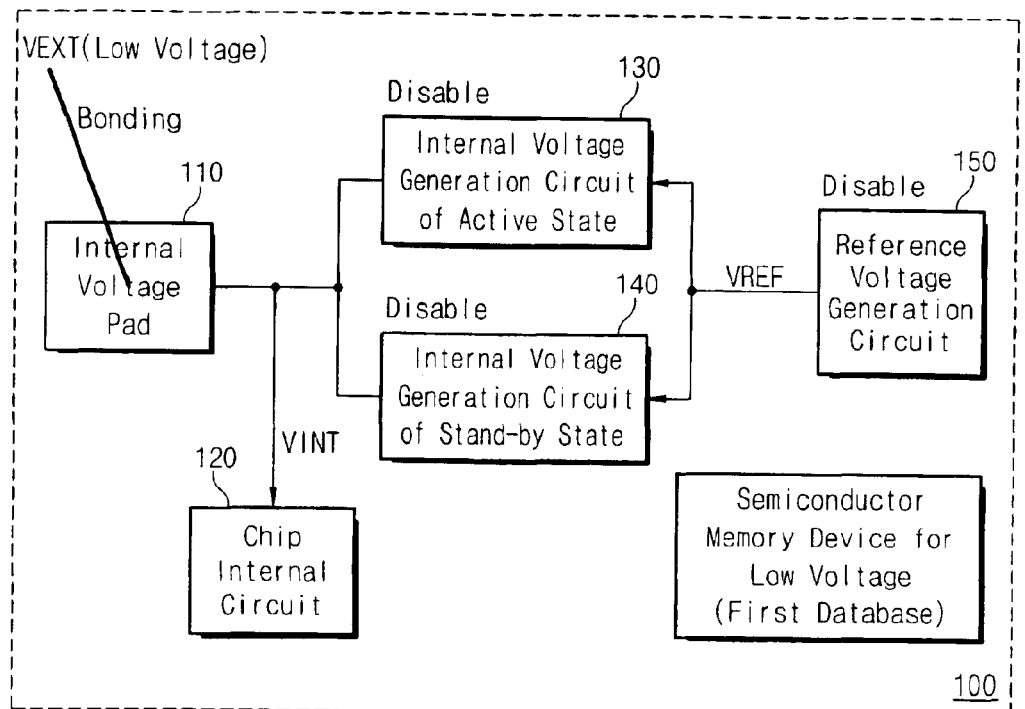
FIG. 1 is a diagram illustrating a conventional external high/low voltage compatible semiconductor memory device.
Figure 1:
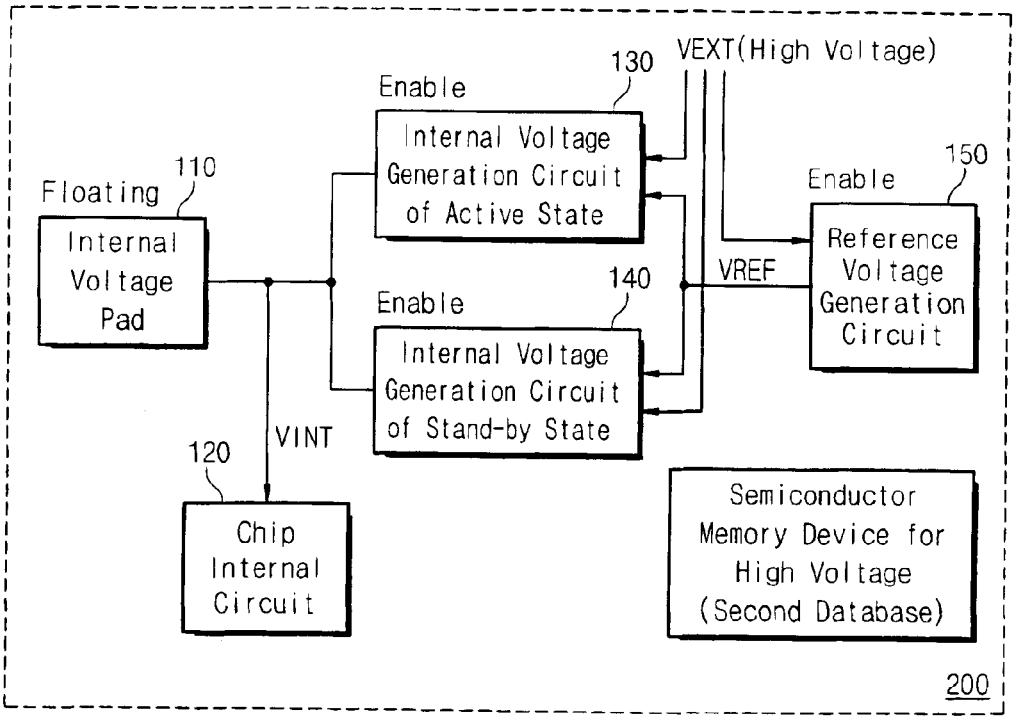
Figure 2:
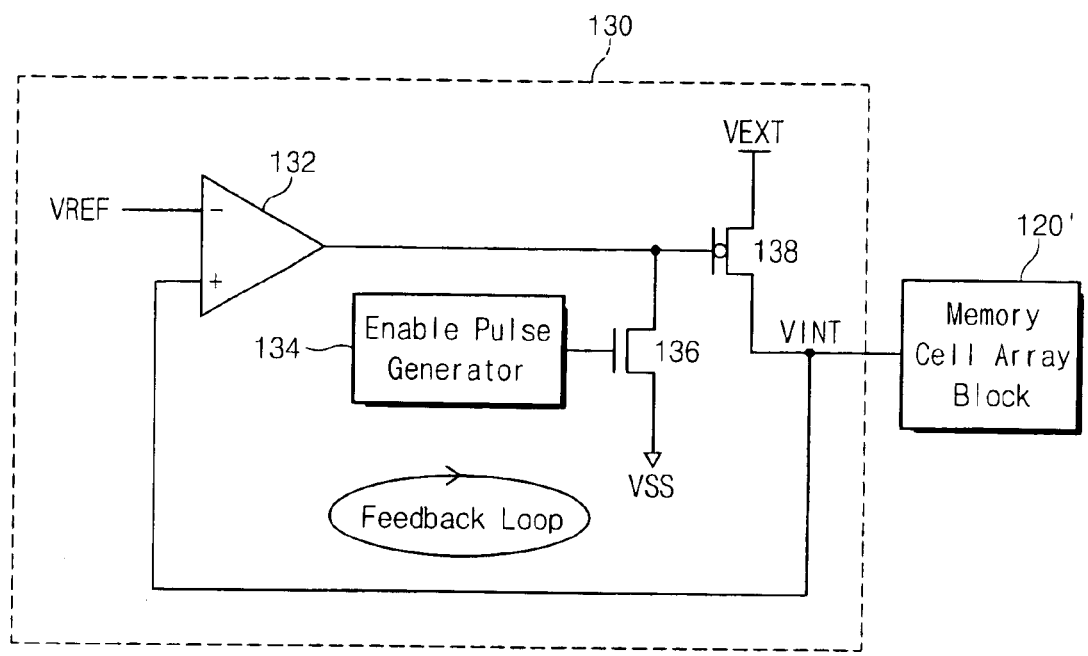
FIG. 2 is a diagram illustrating the external voltage generation circuit of FIG. 1.
Figure 3:
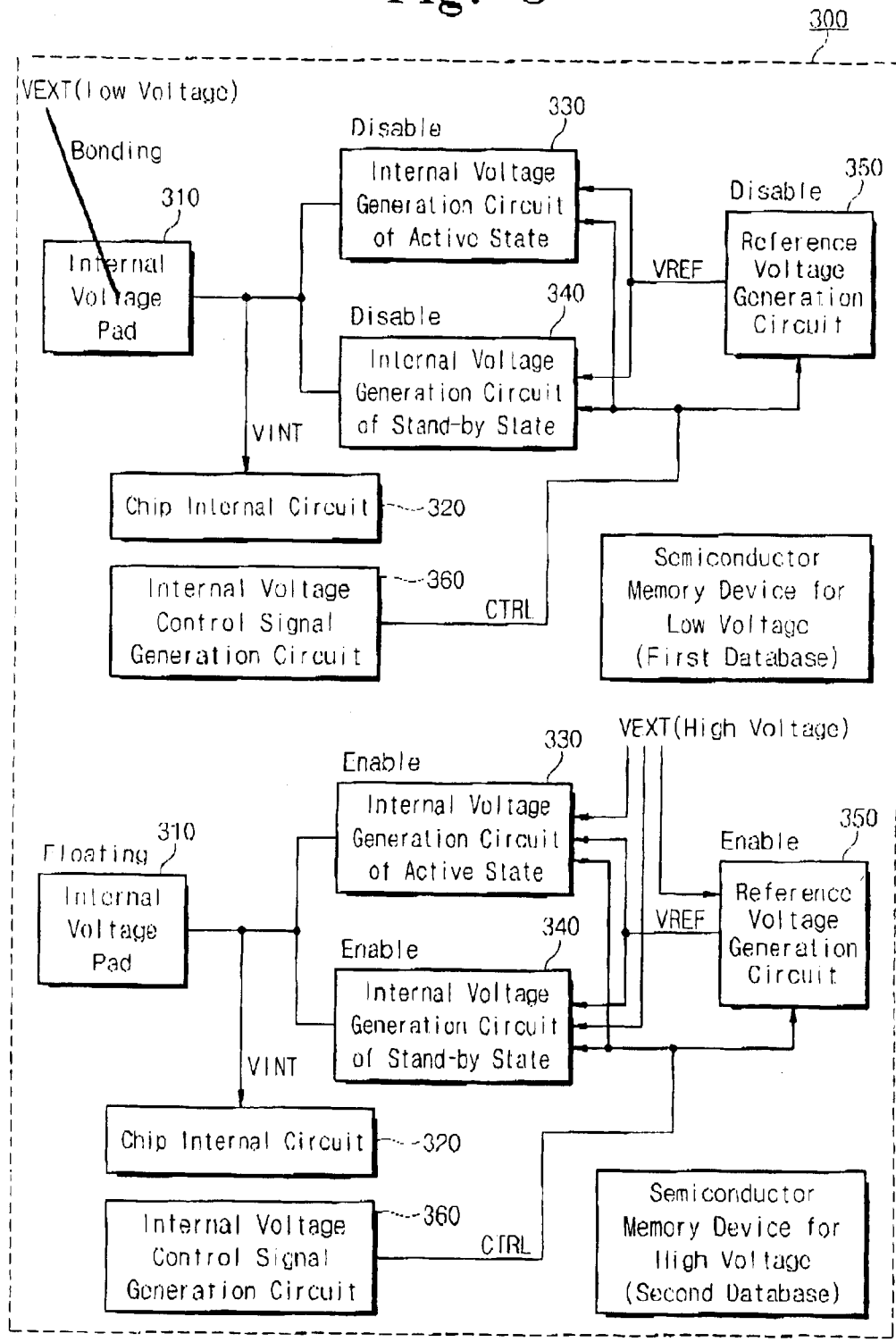
FIG. 3 is a block diagram illustrating an external high/low voltage compatible semiconductor memory device according to an embodiment of the invention.

Referring to FIG. 3, a semiconductor memory device includes an internal voltage pad 310 having one database, a chip internal circuit 320, an internal voltage generation circuit 330 of an active state, an internal voltage generation circuit 340 of a stand-by state, a reference voltage generation circuit 350, and an internal voltage control signal generation circuit 360. The semiconductor memory device 300 is different from the semiconductor memory devices 100 and 200 in that it further includes the internal voltage control signal generation circuit 360.

The internal voltage control signal generation circuit 360 is now explained in detail with reference to FIG. 4 and FIG. 5.

Figure 4:
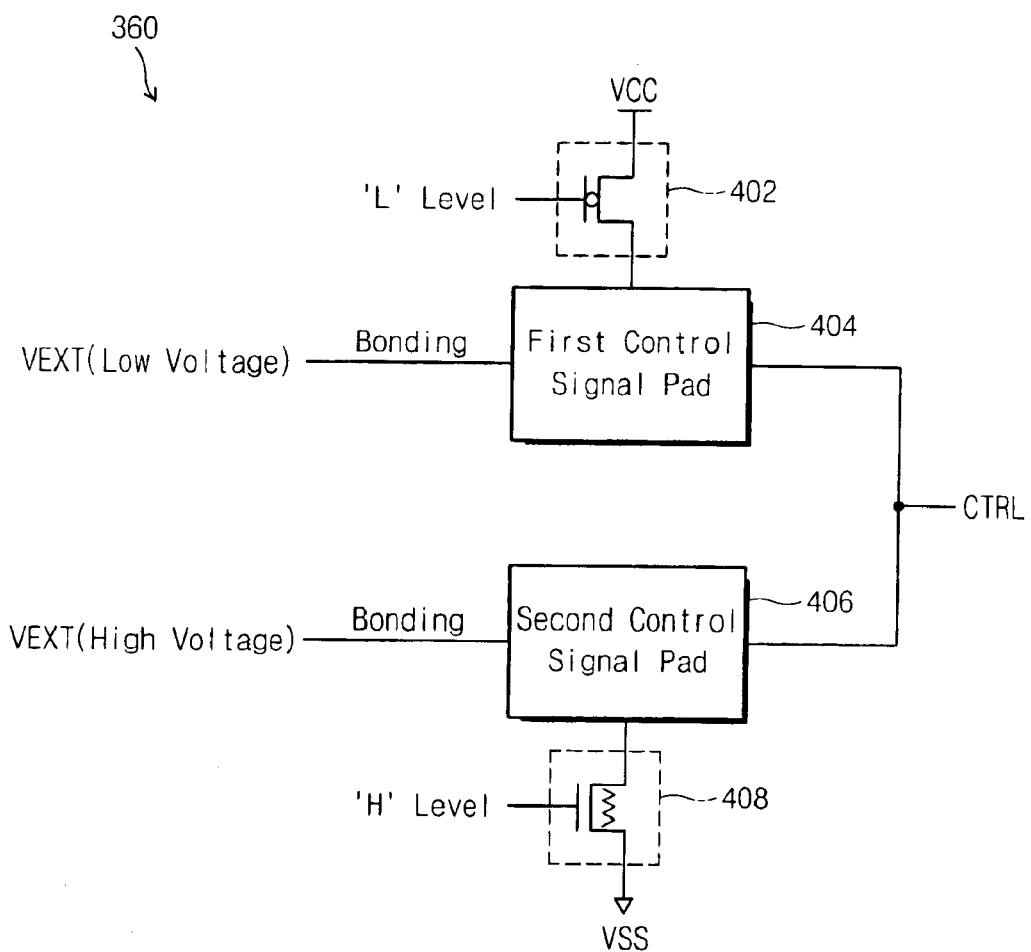
FIG. 4 is a block diagram illustrating the internal voltage control signal generation circuit of FIG. 3.

Referring to FIG. 4, an internal voltage control signal generation circuit 360 according to an embodiment of the invention includes a first driver 402 having a PMOS transistor gated to a low level 'L' between a power supply voltage VCC and a first control signal pad 404 and a second driver 408 having an NMOS transistor gated to a high level 'H' between a ground voltage VSS and a second control signal pad 406. The first control signal pad 404 is connected to the power supply voltage VCC by a turned-on PMOS transistor in the first driver 402, and the second control signal pad 406 is connected to the ground voltage VSS by a turned-on NMOS transistor in the second driver 408.

In the case where the external voltage VEXT is a high voltage, it is bonded to the second control signal pad 406. A high voltage applied to the second control signal pad 406 is short-circuited to the ground voltage VSS. At this time, the longer channel length of the NMOS transistor of the second driver 408 retains the voltage level of the second signal pad 406 at a high level. The second control signal pad 406 transfers the high voltage to an internal voltage control signal CTRL. Referring back to FIG. 3, the internal voltage control signal CTRL at the high level enables an internal voltage generation circuit 330 of an active state, an internal voltage generation circuit 340 of a stand-by state, and a reference voltage generation circuit 350. The internal voltage generation circuits 330 and 340 receive a reference voltage VREF and an external high voltage VEXT to generate a predetermined internal voltage VINT. The internal voltage VINT is provided to a chip internal circuit 320.

In the case where the external voltage VEXT is a low voltage, it is bonded to the first control signal pad 404. In this case, the external voltage VEXT has a lower voltage level than the power supply voltage VCC, and the internal voltage control signal CTRL is at a low level. Returning to FIG. 3, the internal voltage control signal CTRL at the low level disables the internal voltage generation circuit 330 of the active state, the internal voltage generation circuit 340 of the stand-by state, and the reference voltage generation circuit 350. The external low voltage VEXT is bonded to the internal voltage pad 310 to be directly coupled to the internal voltage VINT.

Figure 5:
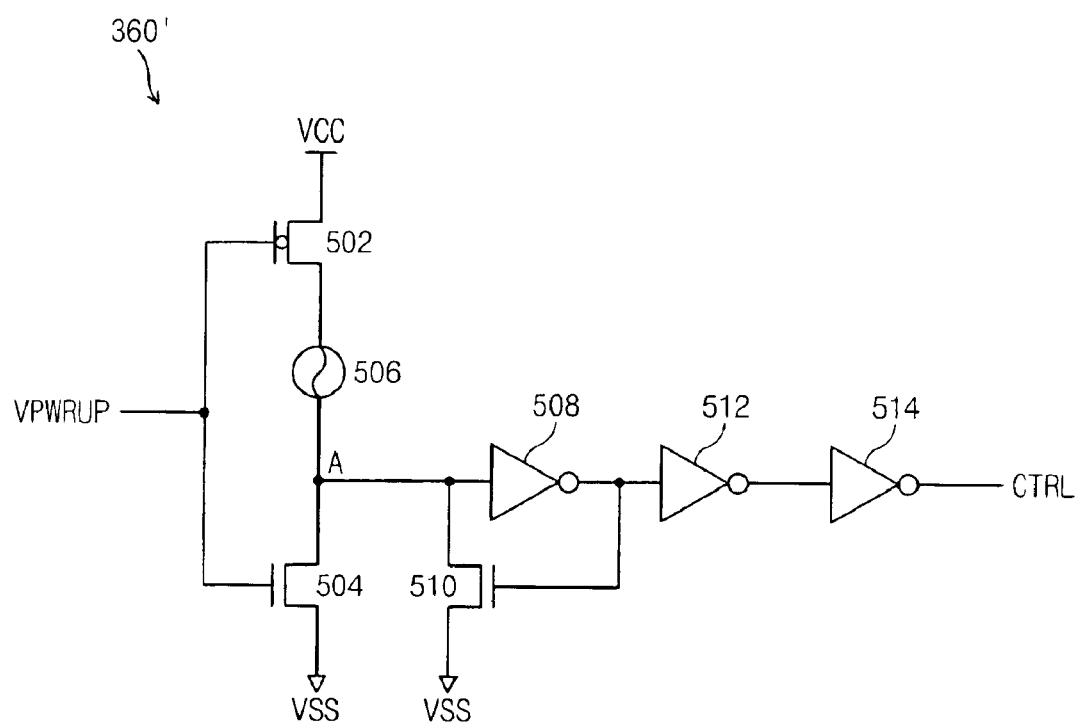
FIG. 5 is a block diagram illustrating the internal voltage control signal generation circuit of FIG. 3 according to another embodiment of the invention.

Referring to FIG. 5, an internal voltage control signal generation circuit 360' according to another embodiment includes a first PMOS transistor 502 and a first NMOS transistor 504, a fuse 506, first to third inverters 508, 512, and 514, and a second NMOS transistor 510. The first PMOS and NMOS transistors 502 and 504 are responsive to a power-up setup voltage VPWRUP with a pulse of a predetermined voltage level in power-up. The fuse 506 is coupled between the first PMOS and NMOS transistors 502 and 504. The first to third inverters 508, 512, and 514 are serially coupled to an output of the first NMOS transistor 504. The second NMOS transistor 510 latches the output of the first NMOS transistor 504 in response to an output of the first inverter 508.

When the external voltage is a high voltage, the fuse 506 is set to be cut. A node "A" becomes low by the power-up setup voltage. An internal voltage control signal CTRL, which is an output of the third inverter 514, is generated with a high level by the node "A" being at the low level. The internal voltage control signal CTRL at a high level enables the internal voltage generation circuit 330 of the active state, the internal voltage generation circuit 340 of the stand-by state, and the reference voltage generation circuit 350. An internal voltage VINT is generated through the enabled circuits 330, 340, and 350.

When the external voltage is a low voltage, the fuse 506 is uncut and the node "A" becomes high by the power-up setup voltage. The internal voltage control signal CTRL becomes low by the node "A" being at the high level. The internal voltage control signal CTRL at a low level disables the internal voltage generation circuit 330 of the active state, the internal voltage generation circuit 340 of the stand-by state, and the reference voltage generation circuit 350. An external low voltage VEXT bonded to the internal voltage pad 310 is directly coupled to the internal voltage VINT.

A semiconductor memory device according to another embodiment of the invention is now described below with reference to FIG. 6.

Figure 6:
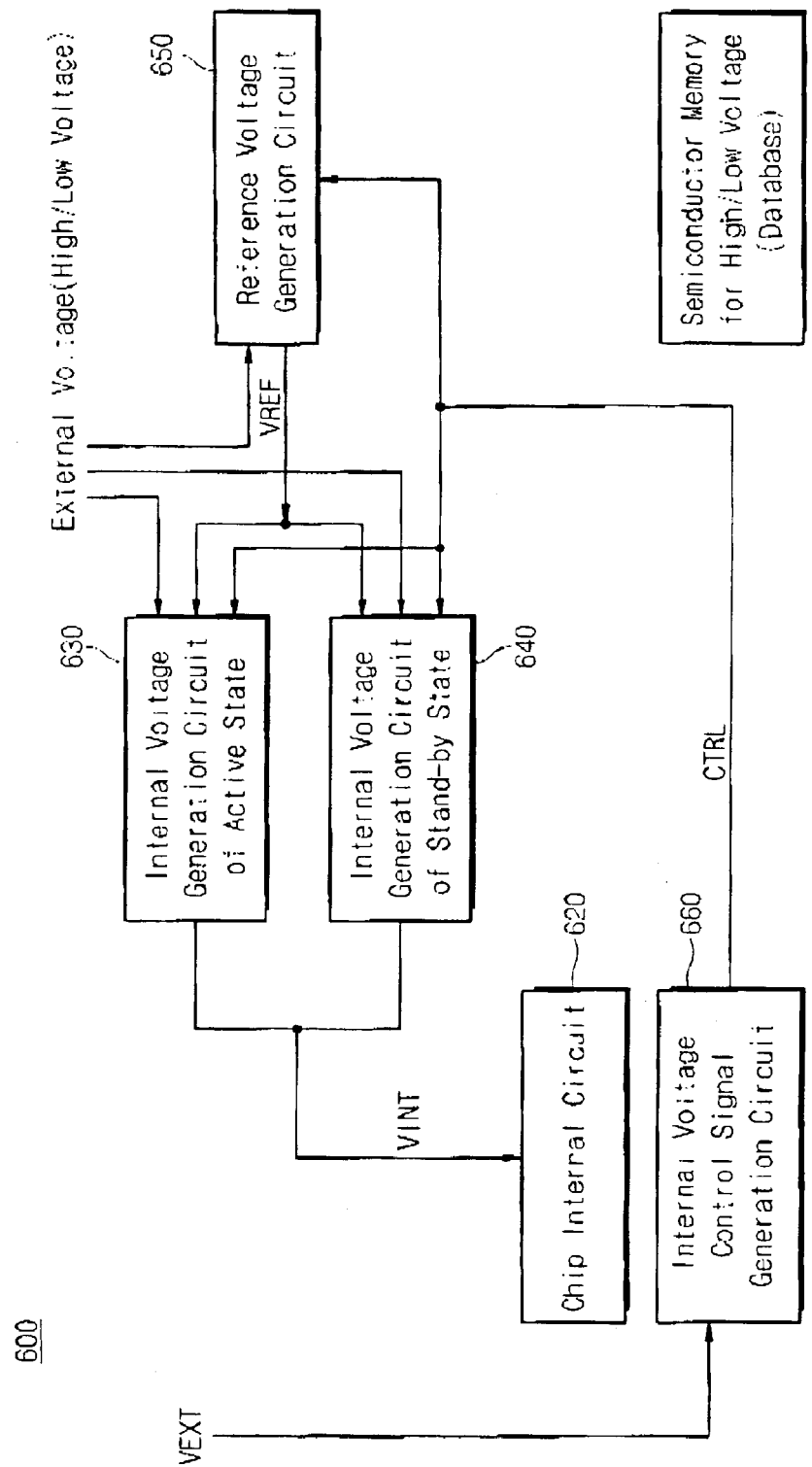
FIG. 6 is a block diagram illustrating an external high/low voltage compatible semiconductor memory device according to another embodiment of the invention.

Referring to FIG. 6, a semiconductor memory device 600 includes a chip internal circuit 620, an internal voltage generation circuit 630 of an active state, an internal voltage generation circuit 640 of a stand-by state, a reference voltage generation circuit 650, and an internal voltage control signal generation circuit 660. Unlike the semiconductor memory device 300 of FIG. 3, the semiconductor memory device 600 does not include the internal voltage pad 310. The internal voltage control signal generation circuit 660 is substantially identical to the internal voltage control signal generation circuit 360 of FIG. 4. The reference voltage generation circuit 650 is illustrated in FIG. 7.

Figure 7:
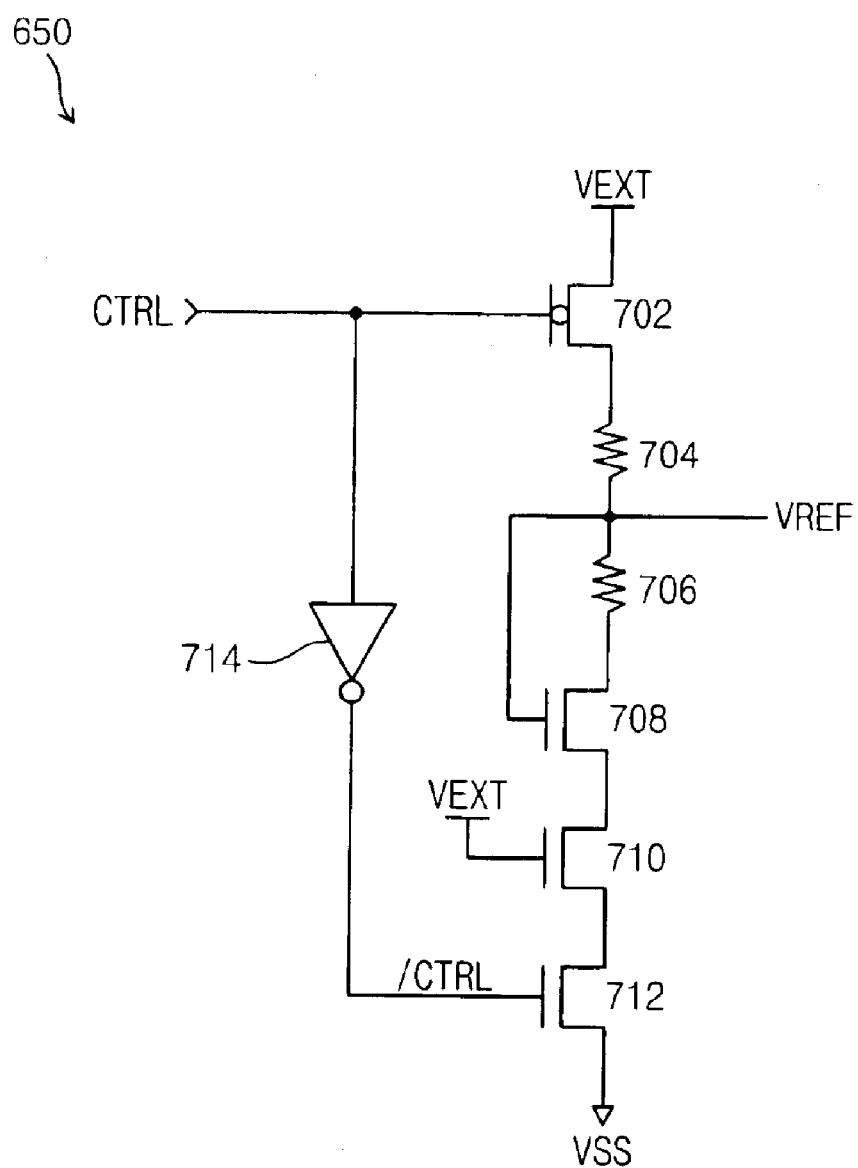
FIG. 7 is a circuit diagram illustrating a reference voltage generation circuit according to embodiments of the invention.

Referring to FIG. 7, the reference voltage generation circuit 650 includes a first PMOS transistor 702, first and second resistors 704 and 706, first to third NMOS transistors 708, 710, and 712, and an inverter 714. The first PMOS transistor 702, the first and second resistors 704 and 706, and the first to third NMOS transistors 708, 710, and 712 are serially coupled between an external voltage VEXT and a ground voltage VSS. The inverter 714 inverts an internal voltage control signal CTRL. The first PMOS transistor 702 and the third NMOS transistor 712 are gated to the internal voltage control signal CTRL and its inverted version /CTRL, respectively. The first and the second NMOS transistors 708 and 710 are gated to a reference voltage VREF and the external voltage VEXT, respectively.

When the external voltage VEXT is a high voltage, the first PMOS transistor 702 and the third NMOS transistor 712 are turned on by the internal voltage control signal CTRL of a low level to enable the reference voltage generation circuit 650. Afterwards, the reference voltage VREF with a predetermined voltage level is generated by the voltage distribution of the turned-on first PMOS transistor 702, the first to third NMOS transistors 708, 710, and 712, and the first and second resistors 704 and 706. On the other hand, when the external voltage VEXT is a low voltage, the first PMOS transistor 702 and the third NMOS transistor 712 are turned off by the internal voltage control signal CTRL of a high level to disable the reference voltage generation circuit 650. Thus, the reference voltage VREF is not generated.

The internal voltage generation circuit 630 according to an embodiment of the invention is now described below with reference to FIG. 8.

Figure 8:
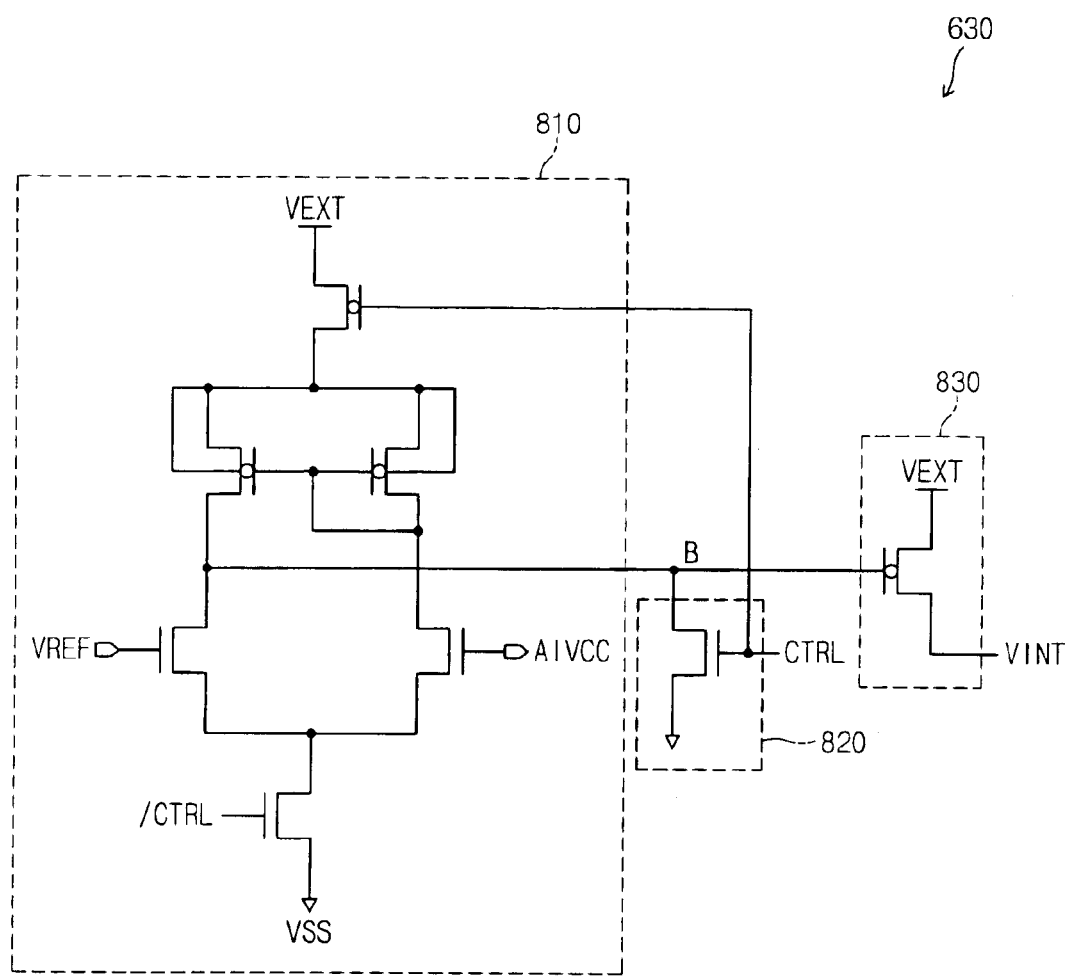
FIG. 8 is a circuit diagram illustrating an internal voltage generation circuit according to an embodiment of the invention.

Referring to FIG. 8, the internal voltage generation circuit 630 includes a comparator 810 for comparing a reference voltage VREF with an internal array power supply voltage AIVCC in response to an internal voltage control signal CTRL and its inverted version/CTRL, a setting unit 820 for setting an output of the comparator 810 in response to the internal voltage control signal CTRL, and a driver unit 830 for generating an internal voltage VINT in response to the output of the comparator 810. The internal array power supply voltage AIVCC is a kind of the internal voltage VINT and ideally has the same voltage level as the reference voltage VREF.

When an external voltage is a high voltage, an NMOS transistor of the setting unit 820 is turned off by the internal voltage control signal CTRL at a low level. The comparator 810 is enabled by the internal voltage control signal CTRL at a low level and an inverted internal voltage control signal /CTRL at a high level. An output node "B" of the comparator 810 is about half of the external voltage VEXT when the reference voltage VREF and the internal array power supply voltage AIVCC are approximately equal to each other. When the node "B" is about half of the external voltage VEXT, a PMOS transistor in the driver circuit 830 is slightly opened, transferring charges of the external voltage VEXT to the internal voltage VINT. As a result, the internal voltage VINT is generated to be lower than the external voltage VEXT.

When the external voltage VEXT is a low voltage, an NMOS transistor in the setting unit 820 is turned on by the internal voltage control signal CTRL at a high level. Thus, the output node "B" of the comparator 810 becomes low. At this time, the comparator 810 is disabled. In response to the node "B" at a low level, the PMOS transistor in the driver unit 830 is turned on to provide the external voltage VEXT to the internal voltage VINT. In using the external low voltage VEXT as the internal voltage VINT, the external voltage VEXT is transferred to the internal voltage VINT through the PMOS transistor in the driver unit 830. This results in an electrostatic discharge (ESD) effect.

In the case where the reference voltage VREF is lower than the internal array power supply voltage AIVCC, a voltage on the output node "B" of the comparator 810 is lowered. The PMOS transistor in the driver unit 830 is more strongly opened by the lowered node "B", transferring more charges of the external voltage VEXT to the internal voltage VINT. Accordingly, a level of the internal voltage VINT rises in order to supplement the lowered internal array power supply voltage AIVCC. On the other hand, in the case where the reference voltage VREF is higher than the internal array power supply voltage AIVCC, the voltage on the node "B" rises to turn off the driver unit 830. Accordingly, the charges of the external voltage VEXT are not provided to the internal voltage VINT any longer.

An internal voltage generation circuit according to another embodiment of the invention is now described below with reference to FIG. 9.

Figure 9:
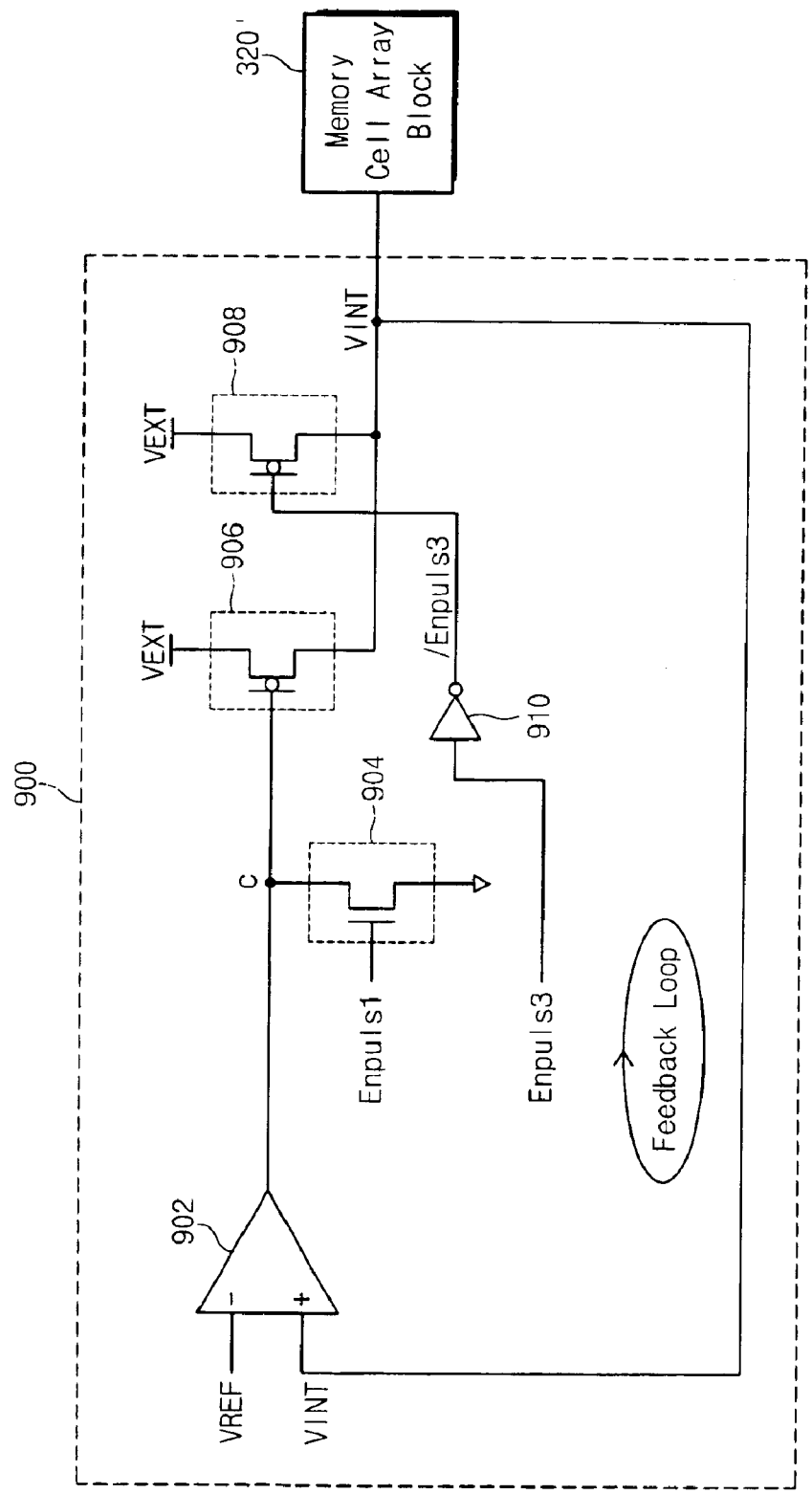
FIG. 9 is a circuit diagram illustrating an internal voltage generation circuit according to another embodiment of the invention.

Referring to FIG. 9, an internal voltage generation circuit 900 includes a comparator 902 for comparing a reference voltage VREF and an internal voltage VINT, a setting unit 904 for setting an output node "C" of the comparator 902 in response to a first enable signal Enpuls1, a first driver unit 906 for transferring an external voltage VEXT to the internal voltage VINT in response to the output node "C" of the comparator 902, and a second driver unit 908 for transferring the external voltage VEXT to the internal voltage VINT in response to an inverted version/Enpuls3 of an third enable signal Enpuls3. The first and third enable signal Enpuls1 and Enpuls3 are generated by an enable signal generation circuit which will be explained in detail later.

When the external voltage VEXT is a high voltage, the first and third enable signals Enpuls1 and Enpuls3 are generated at a low level. The setting unit 904 is disabled in response to the first enable signal Enpuls1 at the low level. In the case where the reference voltage VREF is higher than the internal voltage VINT, a voltage on the output node "C" of the comparator 902 is lowered to transfer charges of the external voltage VEXT to the internal voltage VINT through the first driver unit 906. The second driver unit 908 is disabled by a high level of the inverted third enable signal/Enpuls3. Accordingly, the internal voltage VINT is determined with a predetermined lowered level from the external voltage VEXT by a resistance value of a PMOS transistor in the first driver unit 908. In a case where the reference voltage VREF is lower than the internal voltage VINT, an output of the comparator 902 becomes high to disable the first driver unit 906. As a result, the external voltage VEXT is not provided to the internal voltage VINT.

When the external voltage VEXT is a low voltage, the first enable signal Enpuls1 is generated with the pulse of a high level and the third enable signal Enpuls3 is generated with a high level. During a high level pulse period of the first enable signal Enpuls1, the output node "C" of the comparator 902 becomes low to transfer charges of the external voltage VEXT to the internal voltage VINT through the first driver unit 906. In response to the inverted third enable signal/Enpuls3, the second driver unit 908 is driven to connect the external voltage VEXT with the internal voltage VINT. Since the internal voltage VINT used as the external voltage VEXT is set to a low voltage and the level of the internal voltage VINT is lowered even further by driving a plurality of sense amplifiers in a memory cell array block 320', this connection makes it possible to provide more charges of the external voltage VEXT to the internal voltage VINT.

An internal voltage generation circuit according to yet another embodiment of the invention is now described below with reference to FIG. 10.

Figure 10:
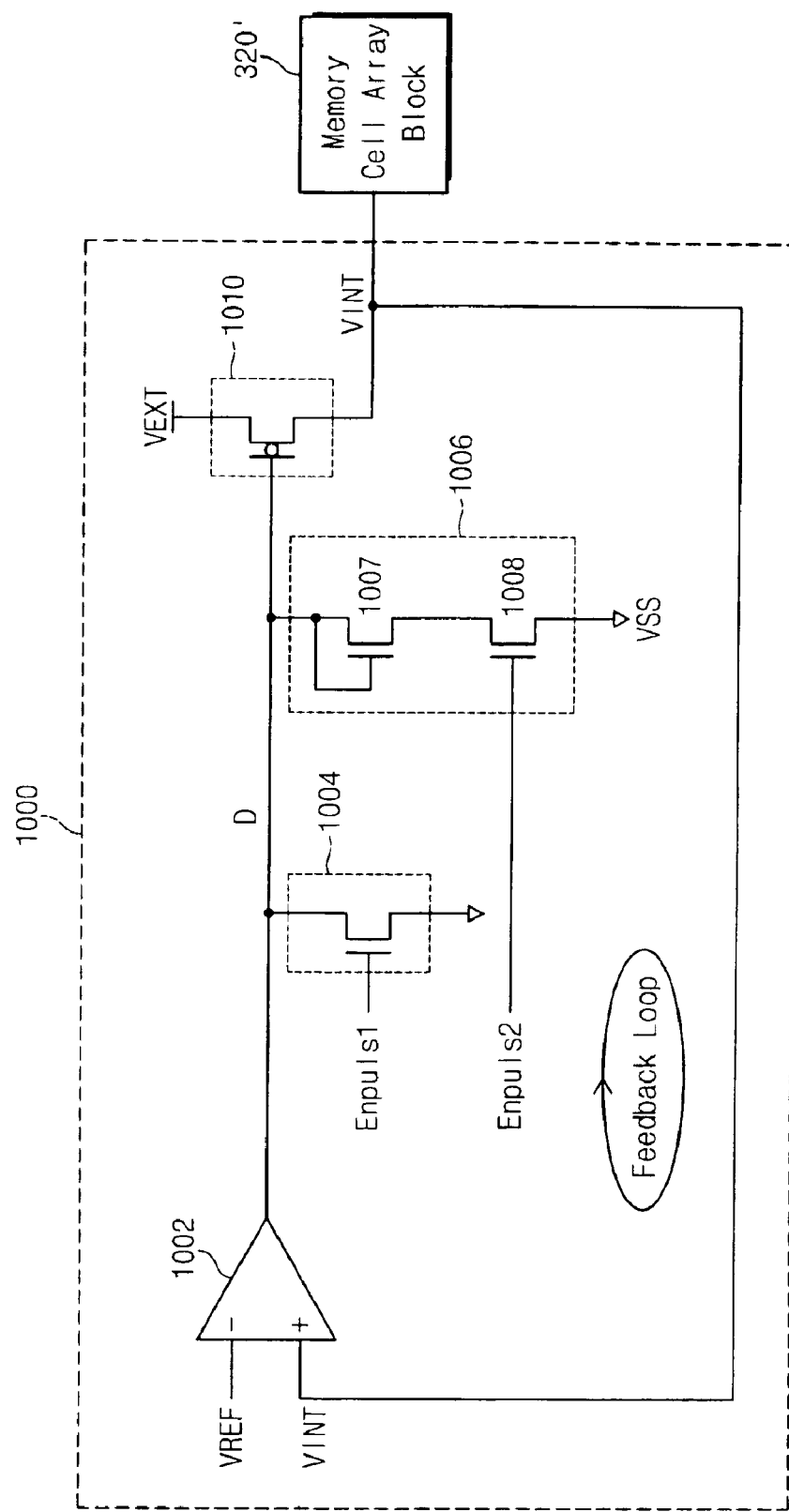
FIG. 10 is a circuit diagram illustrating an internal voltage generation circuit according to yet another embodiment of the invention.

Referring to FIG. 10, an internal voltage generation circuit 1000 includes a comparator 1002 for comparing a reference voltage VREF and an internal voltage VINT, a first setting unit 1004 for setting an output node "D" of the comparator 1002 to a ground voltage VSS in response to a first enable signal Enpuls1, a second setting unit 1006 for setting the output node "D" of the comparator 1002 to a constant voltage level (e.g., 0.7V) after a predetermined delay in response to a second enable signal Enpuls2, a driver unit 1010 for transferring the external voltage VEXT to the internal voltage VINT in response to the output node "D" of the comparator 1002. Similar to the first enable signal Enpuls1, the second enable signal Enpuls2 is generated by an enable signal generation circuit. The first enable signal Enpuls1 is a signal having a high level pulse when the external voltage VEXT is low, and the second enable signal Enpuls2 is a signal having a high level pulse when the external voltage VEXT is high.

When the external voltage VEXT is a high voltage, the first setting unit 1004 is disabled in response to the first enable signal Enpuls1 at a low level. The driver unit 1010 is turned on according to a voltage level of the node "D" of the comparator 1002 and a node "D" voltage level by the second setting unit 1006 responding to the second enable signal Enpuls2 at the high level pulse period. According to a resistance value of the turned-on driver unit 1010, the amount of charges of the external voltage VEXT is regulated. The charges of the external voltage VEXT are transferred to the internal voltage VINT. A diode-connected NMOS transistor 1007 in the second setting unit 1006 acts as a predetermined load for preventing too many charges from being provided to the internal voltage VINT when the external voltage VEXT becomes high.

When the external voltage VEXT is a low voltage, the output node "D" of the comparator 1002 becomes low in response to a high level period of the first enable signal Enpuls1. Thus, the external voltage VEXT is transferred to the internal voltage VINT through the first driver unit 1010.

An internal voltage generation circuit according to still another embodiment of the invention is now described with reference to FIG. 11.

Figure 11:
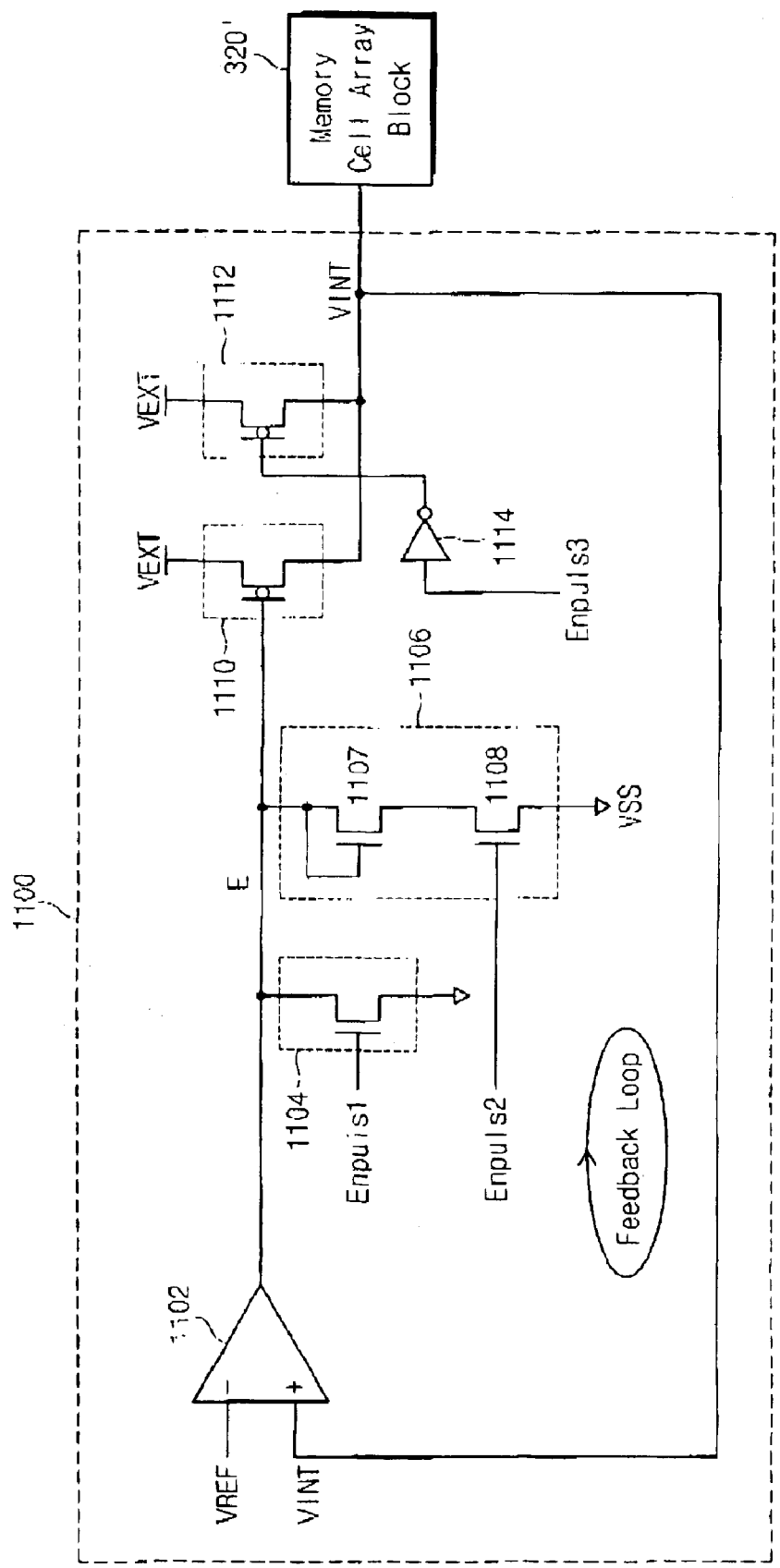
FIG. 11 is a circuit diagram illustrating an internal voltage generation circuit according to still another embodiment of the invention.

Referring to FIG. 11, an internal voltage generation circuit 1100 is the combination of the internal voltage generation circuit 900 of FIG. 9 and the internal voltage generation circuit 1000 of FIG. 10. The internal voltage generation circuit 1100 includes a comparator 1101 for comparing a reference voltage VREF with an internal voltage VINT, a first setting unit 1104 for setting an output node "E" of the comparator 1102 to a ground voltage VSS in response to a first enable signal Enpuls1, a second setting unit 1106 for setting the node "E" to a constant voltage level after a predetermined delay in response to a second enable signal Enpuls2, a first driver unit 1110 for transferring an external voltage VEXT to the internal voltage VINT in response to the output node "E", an inverter 1114 for inverting a third enable signal Enpuls3, and a second driver unit 1112 for transferring the external voltage VEXT to the internal voltage VINT in response to an output of the inverter 1114.

When the external voltage VEXT is a high voltage, the first setting unit 1104 is disabled by the first enable signal Enpuls1 at a low level and the second setting unit 1112 is disabled in response to a high level output of the inverter 1114 based on a low level of the third enable signal Enpuls3. The first driver unit 1110 is turned on according to a voltage level of an output node "E" of the comparator 1102 and a voltage level of a node "E" of the second setting unit 1106 responding to the second enable signal Enpuls2 at a high level pulse period. According to a resistance value of the turned-on driver unit 1110, the amount of charges of the external voltage VEXT is regulated and the charges are transferred to the internal voltage VINT.

When the external voltage VEXT is a low voltage, the first setting unit 1104 is enabled in response to the first enable signal Enpuls1 at a high level. Thus, the node "E" becomes low. The first driver unit 1110 is enabled by the node "E" of a low level to transfer the external voltage VEXT to the internal voltage VINT. Accordingly, the external voltage VEXT is sufficiently transferred to the internal voltage VINT through the first and second driver units 1110 and 1112.

An internal voltage generation circuit according to a different embodiment is now described below with reference to FIG. 12.

Figure 12:
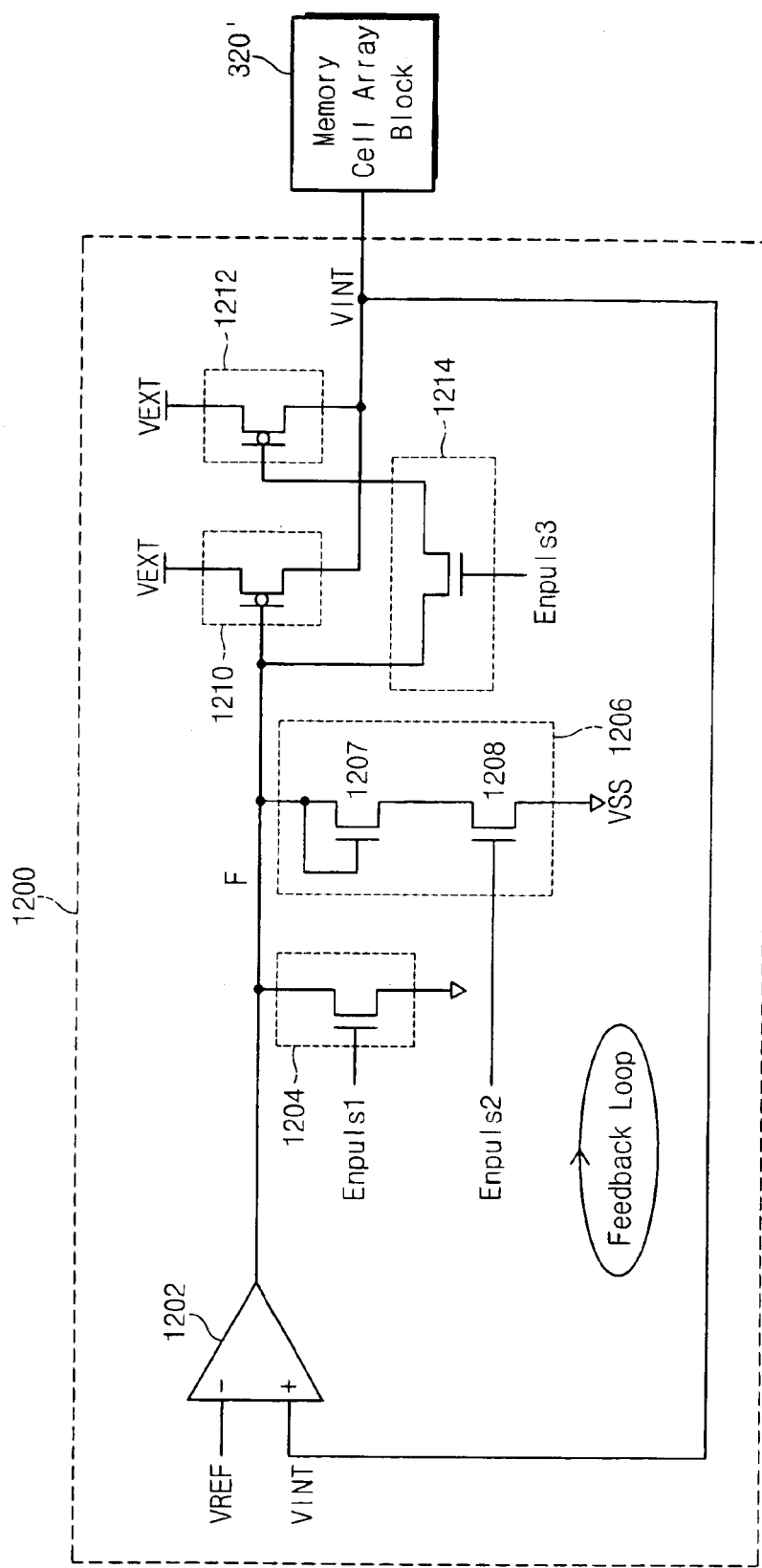
FIG. 12 is a circuit diagram illustrating an internal voltage generation circuit according to a different embodiment of the invention.

Referring to FIG. 12, an internal voltage generation circuit 1200 is different from the internal voltage generation circuit 1100 of FIG. 11 in that it has a transfer unit 1214 instead of the inverter 1114 of FIG. 11. The transfer unit 1214 transfers a voltage level of a comparator output node "F" in response to a third enable signal Enpuls3. Thus, the second driver unit 1212 transfers an external voltage VEXT to an internal voltage VINT according to an output of the transfer unit 1214.

When the external voltage VEXT is a high voltage, a first setting unit 1204 is disabled by a first enable signal Enpuls1 at a low level and the transfer unit 1214 is shut off by the third enable signal Enpuls3 at a low level to disable a second driver unit 1212. The first driver unit 1210 is turned on according to a voltage level of an output node "F" of a comparator 1202 and a voltage level of the node "F" by a second setting unit 1206 responding to a second enable signal Enpuls2 at a high level pulse period. The amount of charges of the external voltage VEXT is regulated according to a resistance value of the turned-on driver unit 1210 and the charges are transferred to the internal voltage VINT.

When the external voltage VEXT is a low voltage, the first setting unit 1204 is enabled by the first enable signal Enpuls1 at a high level. Thus, the node "F" is grounded. The transfer unit 1214 is turned on by the third enable signal Enpuls3 at a high level, so that the second driver unit 1212 is enabled by the node "F" of a ground voltage VSS to transfer the external voltage VEXT to the internal voltage VINT.

An enable pulse signal generation circuit for generating the foregoing first to third enable signals Enpuls1, Enpuls2, and Enpuls3 is now described with reference to FIG. 13.

Figure 13:
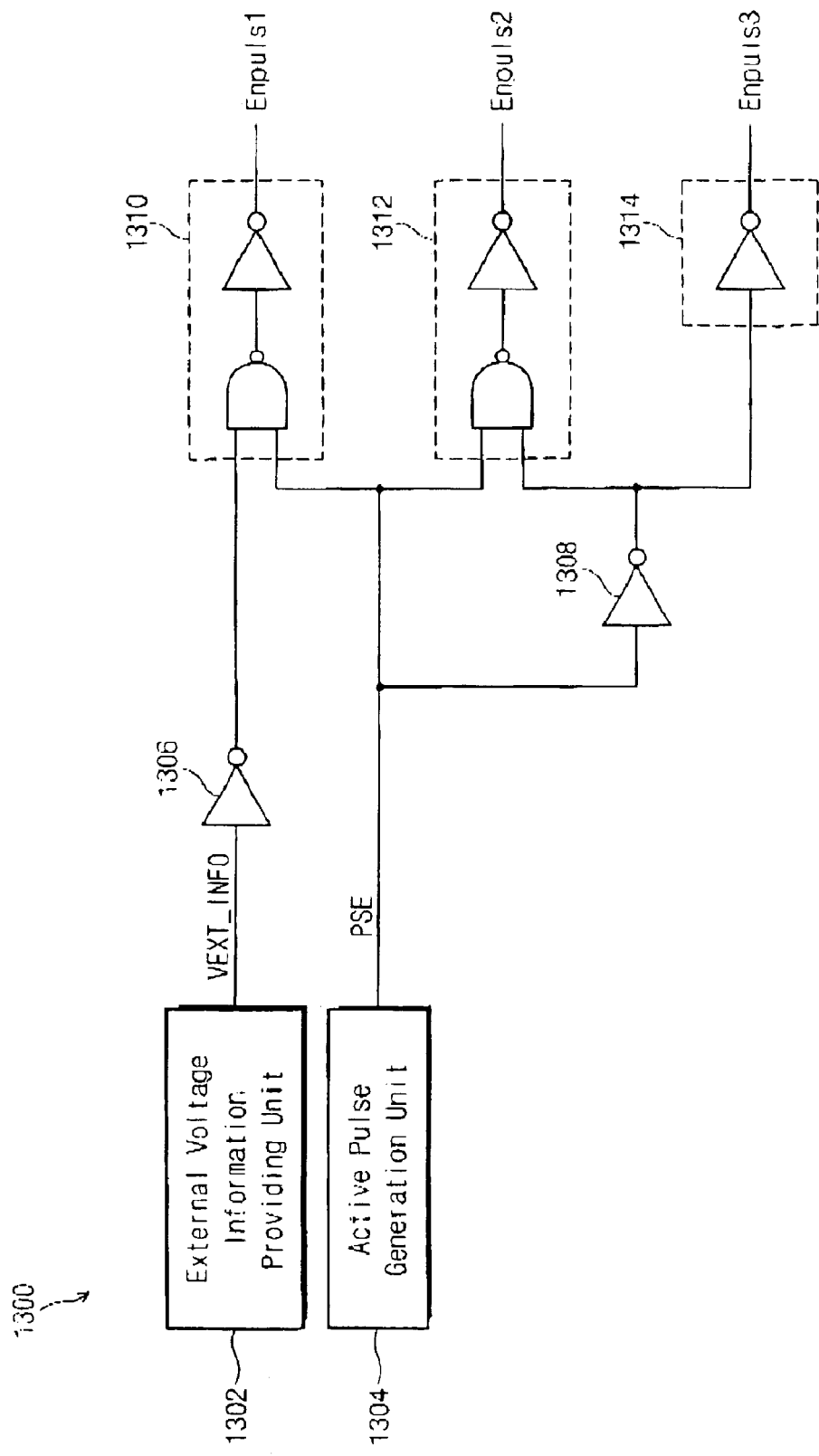
FIG. 13 is a diagram illustrating an enable signal generation circuit according to embodiments of the invention.

Referring to FIG. 13, an enable pulse signal generation circuit 1300 includes an external voltage information providing unit 1302, an active pulse generation unit 1304, a first inverter 1306 for inverting an output VEXT_INFO of the external voltage information providing unit 1302, a second inverter 1308 for inverting an output PSE of the active pulse generation unit 1304, a first enable signal generation unit 1310 for inputting an output of the first inverter 1306 and the active pulse signal PSE to generate a first enable signal Enpuls1, a second enable signal generation unit 1312 for inputting the active pulse signal PSE and an output of the second inverter 1308 to generate a second enable signal Enpuls2, and a third enable signal generation unit 1314 for inputting the output of the second inverter 1308 to generate a third enable signal Enpuls3. The external voltage information providing unit 1302 is provided with a predetermined voltage level according to a voltage level of the external voltage VEXT. Further, the external voltage information providing unit 1302 is set depending upon whether a fuse is short-circuited or opened, a bonding option, and the information stored in a mode register. When the external voltage VEXT is a high voltage, the external voltage information providing unit 1302 becomes high. When the external voltage VEXT is a low voltage, the external voltage information providing unit 1302 becomes low.

An active pulse generation circuit according to embodiments of the invention is now described below with reference to FIG. 14.

Figure 14:
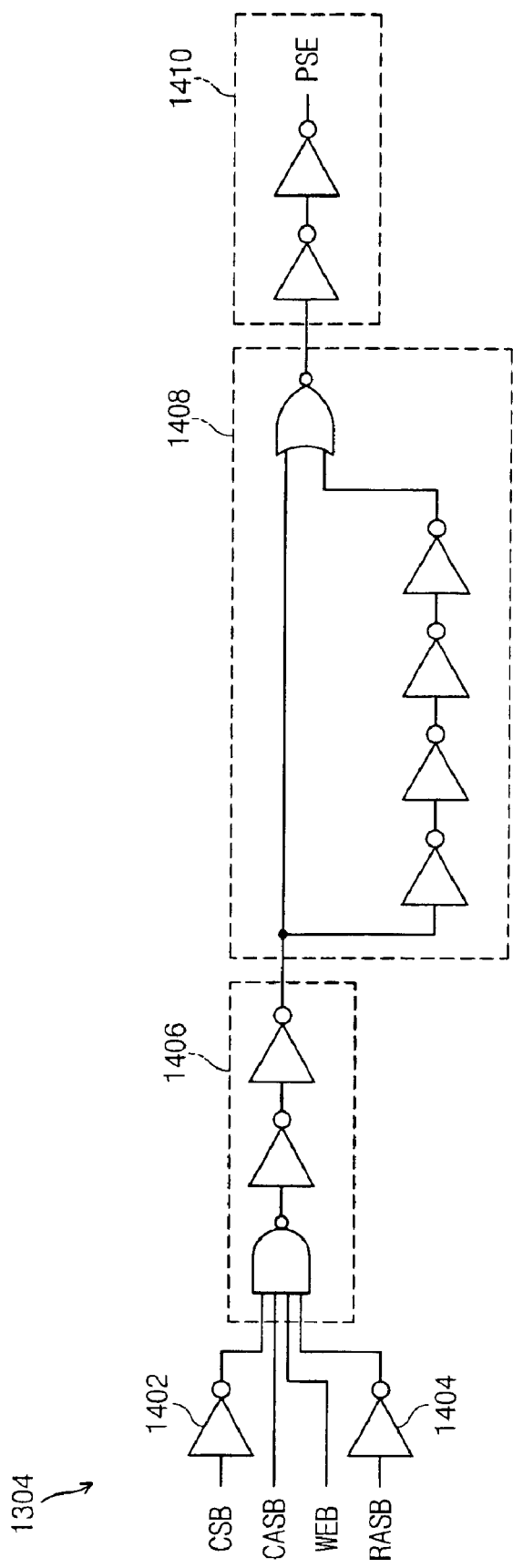
FIG. 14 is a circuit diagram illustrating an active pulse generation circuit according to embodiments of the invention.

Referring to FIG. 14, an active pulse generation circuit 1304 includes a first inverter 1402 for inverting a chip selection signal CSB, a second inverter 1404 for inverting a row address strobe signal RASB, a coding unit 1406 for combining an output of the first inverter 1402, a column address strobe signal CASB, a write signal WEB, and an output of the second inverter 1404, and an auto pulse generation unit 1408 for inputting an output of the coding unit 1406 to generate an active pulse signal PSE.

Figure 15:
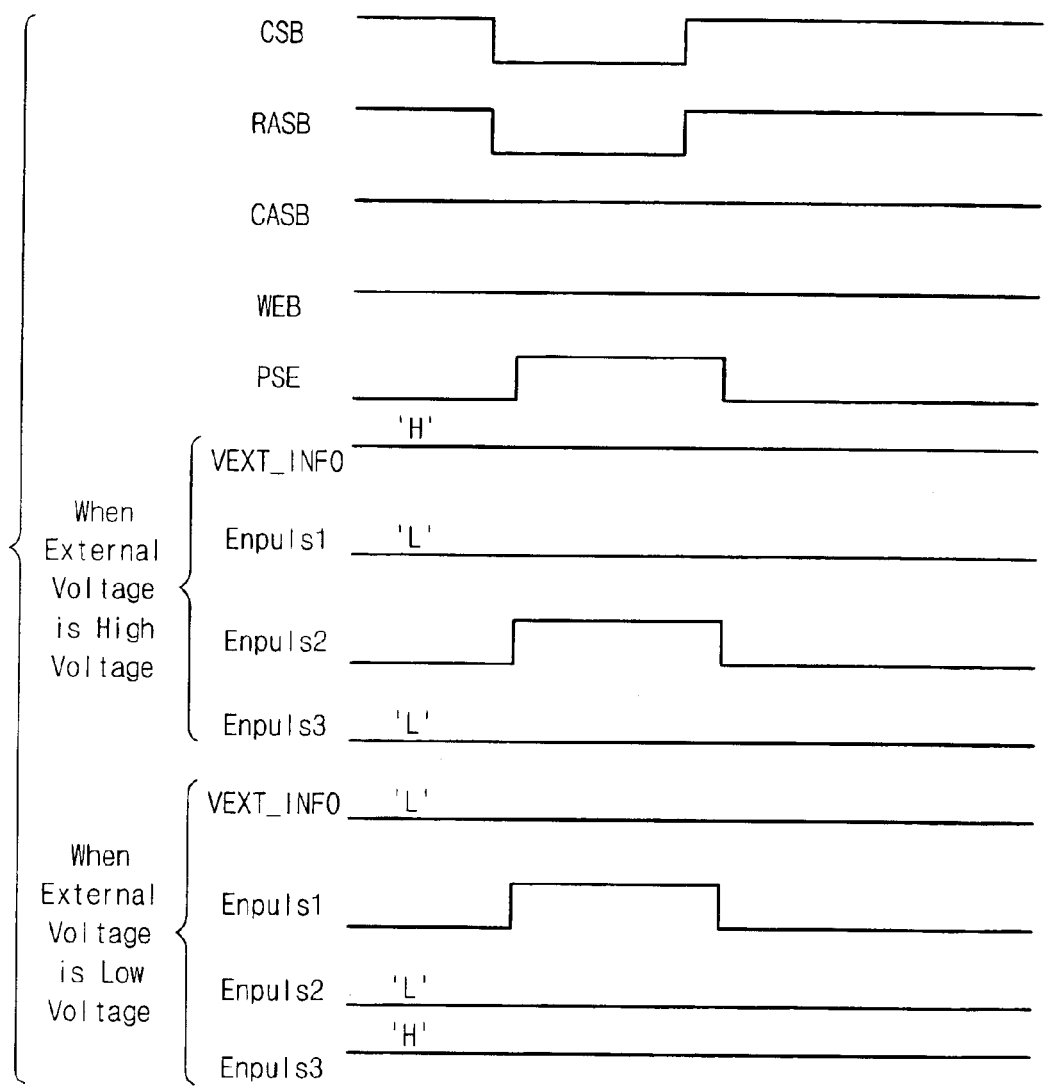
FIG. 15 is a timing diagram for some of the voltages illustrated in FIG. 13 and FIG. 14.

The timing diagrams of the enable signal generation circuit 1300 of FIG. 13 and the active pulse generation circuit 1304 of FIG. 14 are shown in FIG. 15.

Referring to FIG. 15, when the column address strobe signal CASB and the write signal WEB are high, the active pulse signal PSE is generated with a high level pulse in response to the low level period of the chip selection signal CSB and the row address strobe signal RASB. When an external voltage VEXT is a high voltage, an output of an external voltage information providing unit (1302 of FIG. 13) becomes high. Thus, a first enable signal Enpuls1 and a third enable signal Enpuls3 are generated with a low level and a second enable signal Enpuls2 is generated with a high level pulse corresponding to a high level pulse period of the active pulse signal PSE. When the external voltage VEXT is a low voltage, the output of the external voltage information providing unit (1302 of FIG. 13) becomes low. Thus, the first enable signal Enpuls1 is generated with a high level pulse corresponding to a high level pulse period of the active pulse signal PSE, the second enable signal Enpulse2 is generated with a low level, and the third enable signal Enpulse3 is generated with a high level.

Accordingly, the first to third enable signals Enpuls1, Enpuls2, and Enpuls3 generated by an enable signal generation circuit (1300 of FIG. 13) are used as the control signals of the above-described internal voltage generation circuits of FIG. 9, FIG. 10, FIG. 11, and FIG. 12. As a result, an internal voltage VINT is generated according to an external high or low voltage VEXT.

As explained so far, a database of a semiconductor memory device can be managed without classifying the database into a database for a high voltage and a database for a low voltage because of an internal voltage control signal that is selectively generated according to an external high or low voltage. In addition, an internal voltage level is stable because charges provided to the internal voltage are regulated according to a voltage level of the external voltage.

Embodiments of the invention will now be described in a non-limiting way.

In accordance with an embodiment of the invention, a semiconductor memory device includes an internal voltage pad for coupling an external low voltage to an internal voltage, an internal voltage generation circuit for inputting an external high voltage and generating an internal voltage in response to an internal voltage control signal, and an internal voltage control signal generation circuit for generating an internal voltage control signal according to a high or external low voltage. The semiconductor memory device further includes a reference voltage generation circuit for generating a reference voltage compared for stably maintaining the level of the internal voltage.

In accordance with the first embodiment, an internal voltage control signal generation circuit includes a first control signal pad bonded to an external voltage when the eternal voltage is at a low voltage level, a first driver for supplying a power supply voltage to the first control signal pad, a second control signal pad bonded to an external voltage when the external voltage is at a high voltage level, and a second driver for supplying a ground voltage to the second control signal pad.

In accordance with another embodiment of the invention, an external high/low voltage compatible semiconductor memory device may an internal voltage control signal generation circuit for generating an internal voltage control signal according to an external high/low voltage, a reference voltage generation circuit for generating a reference voltage from the external voltage in response to the internal voltage control signal, and an internal voltage generation circuit for comparing the reference voltage in response to the internal voltage generation circuit to an internal voltage from the external voltage.

The reference voltage generation circuit includes a first PMOS transistor that is connected to the external voltage and is gated by the internal voltage control signal, a first resistor having one end coupled to the first PMOS transistor and the other end coupled to the reference voltage, a second resistor having one end coupled to the other end of the first resistor, a first NMOS transistor that is connected to the other end of the second resistor and is gated by the reference voltage, a second NMOS transistor that is coupled to the first NMOS transistor and is gated by the external voltage, a third NMOS transistor that is connected to the second NMOS transistor and is gated by an inverted version of the internal voltage control signal.

The internal voltage generation circuit includes a comparator for comparing the reference voltage with the internal voltage in response to the internal voltage control signal, a setting unit for setting an output of the comparator in response to the internal voltage control signal, and a driver unit for generating an internal voltage in response to the output of the comparator.

In accordance with the another embodiment of the invention, an internal voltage generation circuit includes a comparator for comparing a reference voltage with an internal voltage, a setting unit for setting an output of the comparator in response to a first enable signal, a first driver unit for providing an external voltage as the internal voltage in response to an output of the comparator, and a second driver unit for providing an external voltage as the internal voltage in response to a third enable signal.

In accordance with still another embodiment of the invention, an internal voltage generation circuit includes a comparator for comparing a reference voltage with an internal voltage, a first setting unit for setting an output of the comparator in response to a first enable signal, a second setting unit for setting the output of the comparator after a predetermined delay time in response to a second enable signal, a first driver unit for providing an external voltage as the internal voltage in response to the output of the comparator, and a second driver unit for providing an external voltage as the internal voltage in response to a third enable signal.

In accordance with yet another embodiment of the invention, an internal voltage generation circuit includes a comparator for comparing a reference voltage with an internal voltage, a first setting unit for setting an output of the comparator in response to a first enable signal, a second setting unit for setting the output of the comparator after a predetermined delay time in response to a second enable signal, a first driver for providing an external voltage as the internal voltage in response to the output of the comparator, and a second driver unit for providing an external voltage as the internal voltage in response to a third enable signal.

In accordance with a different embodiment of the invention, an internal voltage generation circuit includes a comparator for comparing a reference voltage with an internal voltage, a first setting unit for setting an output of the comparator in response to a first enable signal, a second setting unit for setting the output of the comparator after a predetermined delay time in response to a second enable signal, a transfer unit for transferring the output of the comparator in response to a third enable signal, a first driver unit for providing an external voltage as the internal voltage in response to the output of the comparator, and a second driver unit for providing an external voltage as the internal voltage in response to an output of the transfer unit. The first and third enable signals are activated when the external voltage is at a low voltage level, and the second enable signal is activated when the external voltage is at a high voltage level.

While preferred embodiments of the invention have been described, additional variations and modifications in those embodiments may occur to those skilled in the art once they learn of the basic inventive concepts. Therefore, it is intended that the appended claims shall be construed to include both the preferred embodiment and all such variations and modifications as fall within the spirit and scope of the invention.

We claim:

1. A semiconductor memory device compatible with an external voltage having a high voltage level and a low voltage level comprising:
    an internal voltage pad configured to connect the external voltage with an internal voltage when the external voltage is at the low voltage level;
    an internal voltage generation circuit configured to generate the internal voltage in response to an internal voltage control signal when the external voltage is at the high voltage level; and
    an internal voltage control signal generation circuit configured to generate the internal voltage control signal according to the external voltage.

2. The semiconductor memory device of claim 1, further comprising a reference voltage generation circuit configured to generate a reference voltage that stably maintains the level of the internal voltage.

3. The semiconductor memory device of claim 1, wherein the internal voltage control signal generation circuit comprises:
    a first control signal pad bonded to the external voltage when the external voltage is at the low voltage level;
    a first driver for supplying a power supply voltage to the first control signal pad;
    a second control signal pad bonded to the external voltage when the external voltage is at the high voltage level; and
    a reference voltage generation circuit for generating a reference voltage from the external voltage in response to the internal voltage control signal; and
    an internal voltage generation circuit for comparing the reference voltage in response to the internal voltage control signal and generating an internal voltage from the external voltage.

4. The semiconductor memory device of claim 1, wherein the internal voltage control signal generation circuit includes:

a fuse that is selectively shorted according to the voltage level of the external voltage;
    a first PMOS transistor configured to respond to a power-up setup voltage, the first PMOS transistor being disposed between a power supply voltage and the fuse;
    a first NMOS transistor configured to respond to the power-up setup signal, the first NMOS transistor being disposed between a ground voltage and the fuse;
    an inverter chain configured to generate the internal voltage control signal in response to an output of the first NMOS transistor; and
    a second NMOS transistor configured to latch the output of the first NMOS transistor in response to an output of a first inverter in the inverter chain.

5. A semiconductor memory device compatible with an external voltage having a high and a low voltage level, the device comprising:
    an internal voltage control signal generation circuit configured to generate an internal voltage control signal according to the external voltage at the high or low voltage level;
    a reference voltage generation circuit configured to generate a reference voltage from the external voltage in response to the internal voltage control signal; and
    an internal voltage generation circuit configured to compare the external voltage with the reference voltage in response to the internal voltage control signal and configured to generate an internal voltage from the external voltage.

6. The semiconductor memory device of claim 5, wherein the internal voltage control signal generation circuit comprises:
    a first control signal pad bonded to the external voltage when the external voltage is at the low voltage level;
    a first driver configured to supply a power supply voltage to the first control signal pad;
    a second control signal pad bonded to the external voltage when the external voltage is at the high voltage level; and
    a second driver configured to supply a ground voltage to the second control signal pad.

7. The semiconductor memory device of claim 5, wherein the internal voltage control signal generation circuit comprises:
    a fuse that is selectively short-circuited according to the voltage level of the external voltage;
    a first PMOS transistor configured to respond to a power-up setup voltage, the first PMOS transistor being disposed between a power supply voltage and the fuse;
    a first NMOS transistor configured to respond to the power-up setup signal, the first NMOS transistor being disposed between a ground voltage and the fuse;
    an inverter chain configured to generate the internal voltage control signal in response to an output of the first NMOS transistor; and
    a second NMOS transistor configured to latch the output of the first NMOS transistor in response to an output of a first inverter in the inverter chain.

8. The semiconductor memory device of claim 5, wherein the reference voltage generation circuit comprises:
    a PMOS transistor coupled to the external voltage and gated to the internal voltage control signal;
    a first resistor having an end coupled to the PMOS transistor and another end coupled to the reference voltage;

a second resistor having an end coupled to the another end of the first resistor;

a first NMOS transistor coupled to another end of the second resistor and gated to the reference voltage;

a second NMOS transistor coupled to the first NMOS transistor and gated to the external voltage; and a third NMOS transistor coupled to the second NMOS transistor and gated to an inverted version of the internal voltage control signal.

9. The semiconductor memory device of claim 5, wherein the internal voltage generation circuit comprises:

a comparator configured to compare the reference voltage with the internal voltage in response to the internal voltage control signal;

a setting unit configured to set an output of the comparator in response to the internal voltage control signal; and a driver unit configured to generate the internal voltage in response to the output of the comparator.

10. An internal voltage generation circuit comprising:

a comparator configured to compare a reference voltage with an internal voltage;

a setting unit configured to set an output of the comparator in response to an enable signal;

a first driver unit configured to provide an external voltage as the internal voltage in response to the output of the comparator; and a second driver unit configured to provide the external voltage as the internal voltage in response to another enable signal.

11. The internal voltage generation circuit of claim 10, wherein the enable signal and the another enable signal are activated when the external voltage is at a low voltage level.

* * * * *